(12) United States Patent
Chen et al.

(10) Patent No.: US 8,018,280 B2
(45) Date of Patent: Sep. 13, 2011

(54) THERMAL REGULATION OF A CLASS-D AUDIO AMPLIFIER

(75) Inventors: Chun-Tsung Chen, Taipei (TW);
Jwin-Yen Guo, Zhubei (TW);
Chung-Fu Wang, Hsinchu (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 12/591,030

(22) Filed: Nov. 5, 2009

(65) Prior Publication Data

US 2010/0117731 A1 May 13, 2010

(30) Foreign Application Priority Data

Nov. 10, 2008 (TW) ................................ 97143388 A

(51) Int. Cl.
*H03F 3/217* (2006.01)

(52) U.S. Cl. ........................................ 330/251; 330/289
(58) Field of Classification Search ................... 330/251, 330/207 A, 10, 289
See application file for complete search history.

(56) References Cited

U.S. PATENT DOCUMENTS 7,840,015 B1 * 11/2010 Melanson et al. ............ 381/107
7,859,334 B2 * 12/2010 Sarkees et al. ................ 330/129

* cited by examiner

*Primary Examiner* — Henry K Choe
(74) *Attorney, Agent, or Firm* — Rosenberg, Klein & Lee

(57) ABSTRACT

A class-D audio amplifier is protected by thermal regulation which decreases the gain of the class-D audio amplifier by asserting an over-temperature signal when the temperature of the class-D audio amplifier is detected to be higher than a threshold. The output of the class-D audio amplifier is therefore reduced by the smaller gain, and the chance for the class-D audio amplifier to stop working due to overheating is greatly reduced.

17 Claims, 8 Drawing Sheets the amplified input signal, and an over-temperature protection circuit to assert an over-temperature signal to decrease the gain if the temperature of the class-D audio amplifier in operation is detected to be higher than a temperature threshold.

Preferably, the over-temperature protection circuit asserts a second over-temperature signal to further decrease the gain if the first over-temperature signal is detected to last for a time period longer than a time threshold.

Preferably, the over-temperature protection circuit asserts a second over-temperature signal to further decrease the gain if the temperature is detected to be higher than a second temperature threshold.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
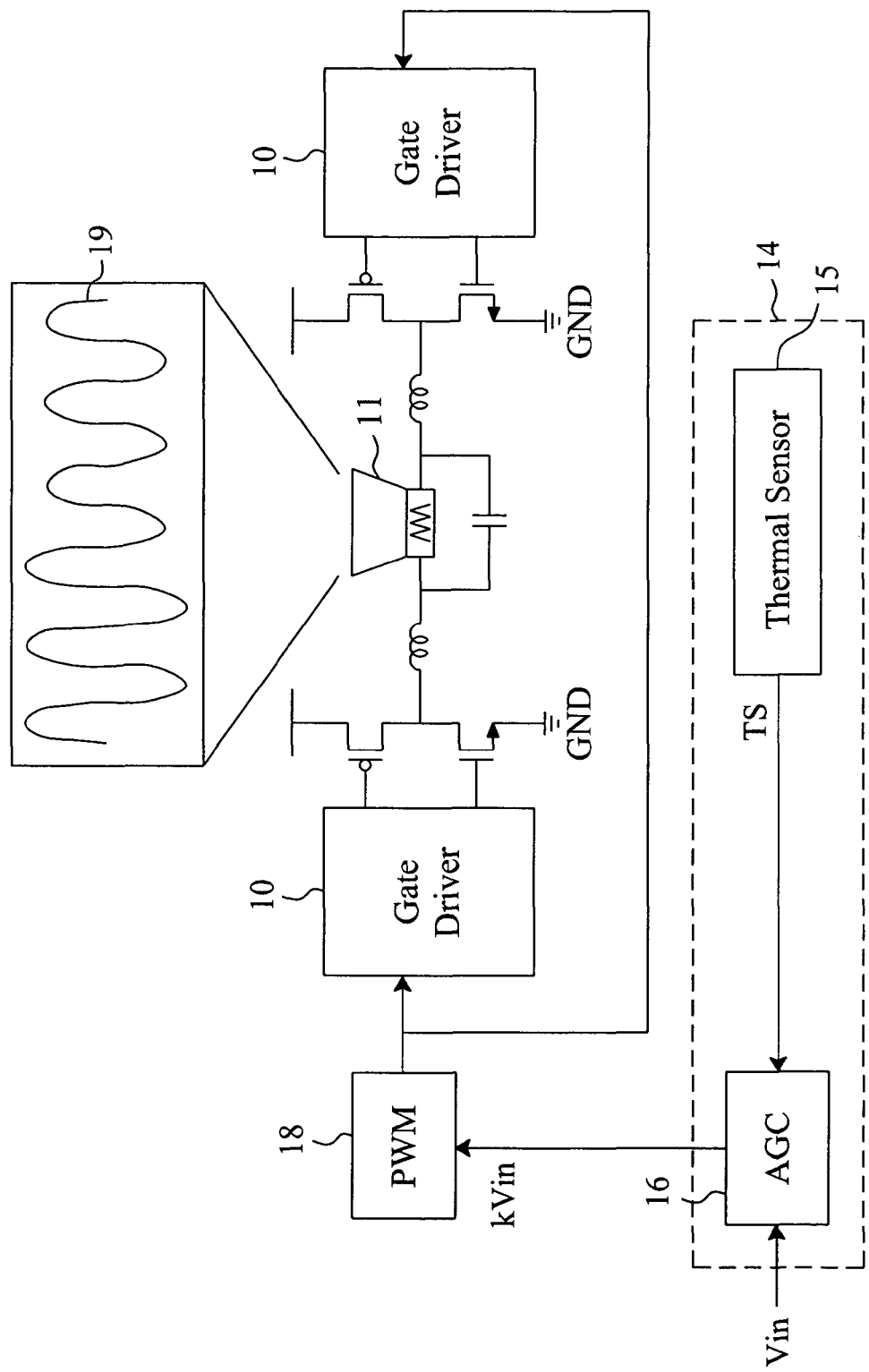
FIG. 2 is a system diagram of a class-D audio amplifier with thermal regulation according to the present invention.

FIG. 2 is a system diagram of a class-D audio amplifier with thermal regulation according to the present invention, in which a thermal regulation apparatus 14 includes a thermal sensor 15 and an automatic gain controller (AGC) 16. The automatic gain controller 16 amplifies the audio input signal Vin to be kVin for a pulse width modulator (PWM) 18 to provide a PWM signal accordingly for the gate driver 10. The thermal sensor 15 is configured to monitor the temperature of the class-D audio amplifier in operation to assert an over-temperature signal TS to signal the automatic gain controller 16 to decrease the gain k of the class-D audio amplifier if it detects the temperature being higher than a temperature threshold, for example 100° C. Eventually, the signal kVin in the input of the pulse width modulator 18 decreases, resulting in attenuation in the output of the class-D audio amplifier, as shown by the waveform 19. With this in-advance gain reduction mechanism, the temperature of the class-D audio amplifier is prevented from going too high.

Figure 3:
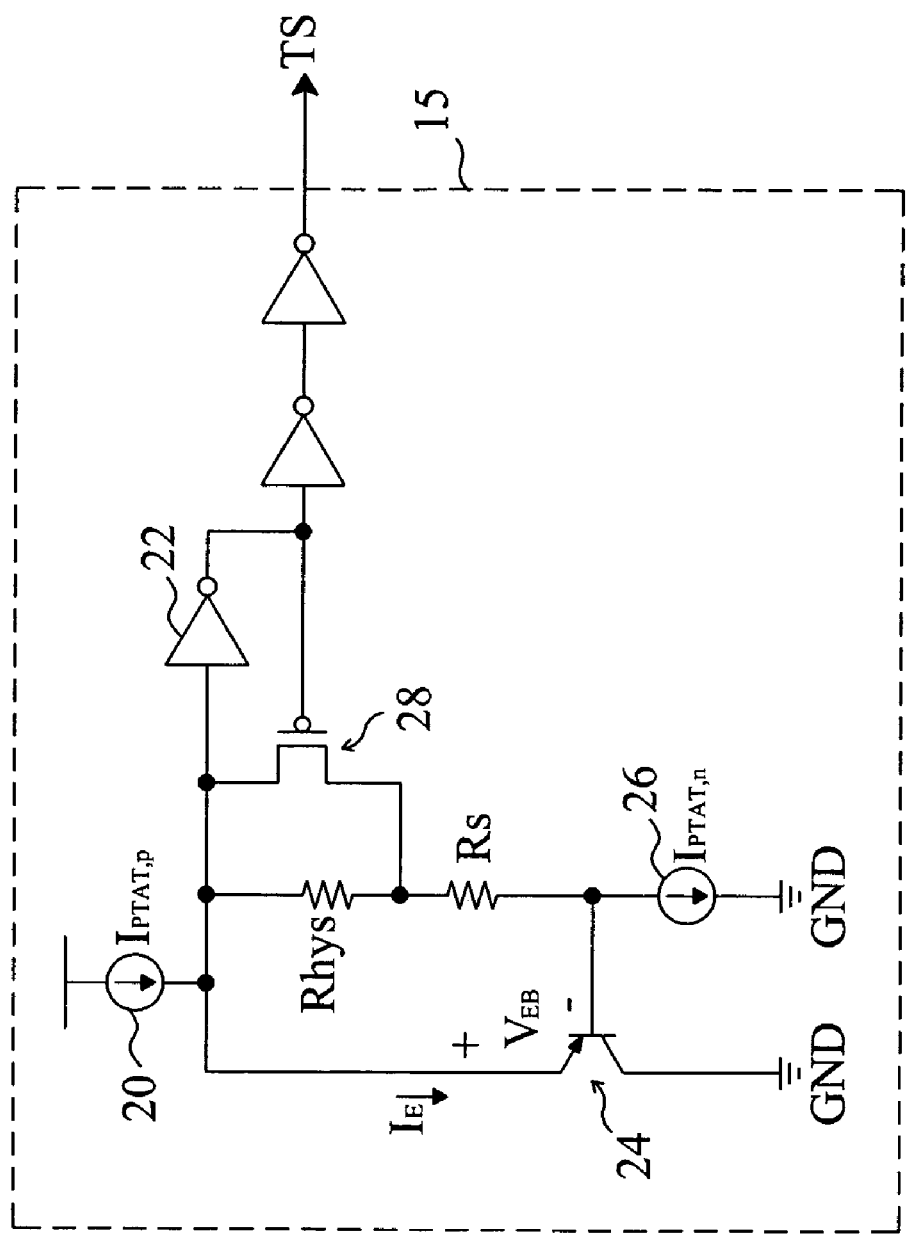
FIG. 3 is a circuit diagram of a thermal sensor in an embodiment of the present invention.

Thermal escape refers to the phenomenon in which the leakage current at the PN junction of a bipolar junction transistor increases with the temperature of the bipolar junction transistor so that the base-emitter voltage ($V_{BE}$) decreases and as the leakage current increases, the temperature of the bipolar junction transistor continues rising, thereby further decreasing the base-emitter voltage. This feature is used for the design of the thermal sensor 15, as shown in FIG. 3, in

THERMAL REGULATION OF A CLASS-D AUDIO AMPLIFIER

FIELD OF THE INVENTION

The present invention is related generally to a class-D audio amplifier and, more particularly, to an over-temperature protection of a class-D audio amplifier.

BACKGROUND OF THE INVENTION

Figure 1:
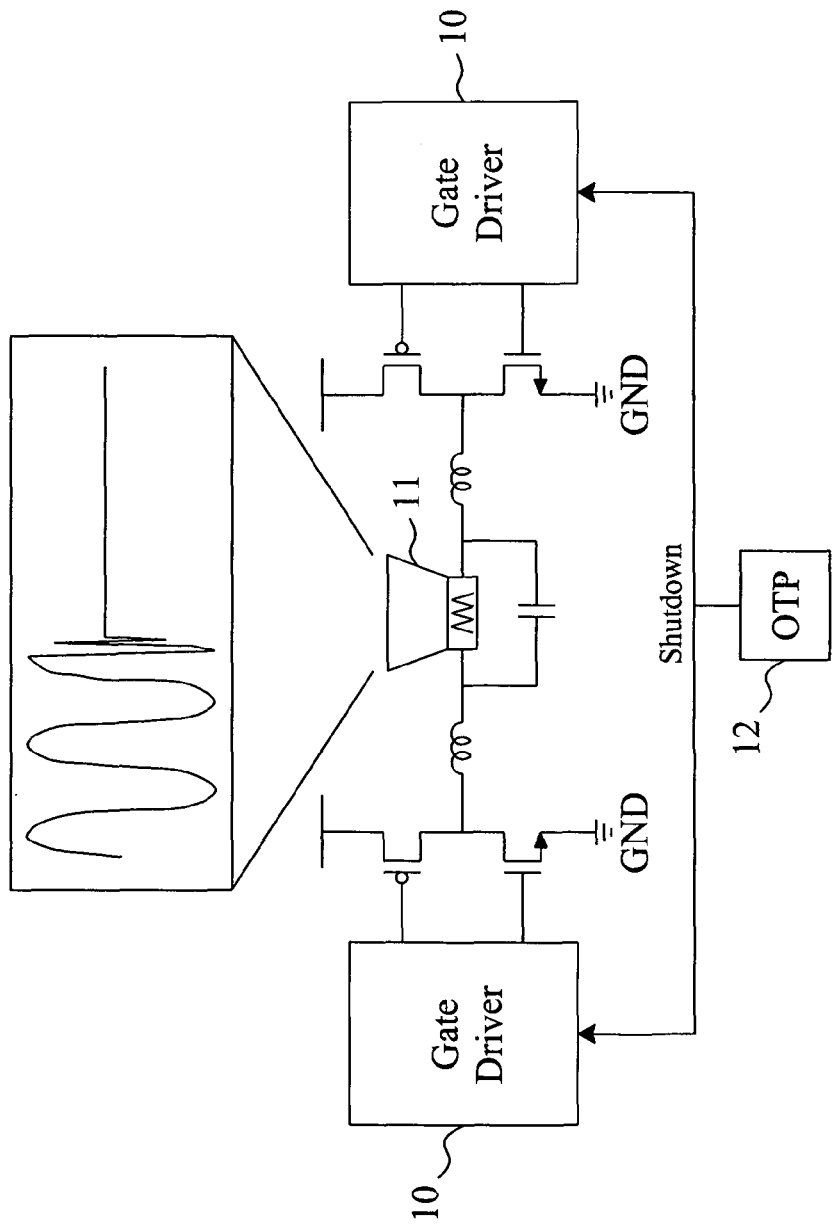
FIG. 1 is a system diagram of a conventional class-D audio amplifier with over-temperature protection.

Generally, a class-D audio amplifier is provided with over-temperature protection circuitry to prevent the class-D audio amplifier from being overheated or burn-out. As shown in FIG. 1, when an over-temperature protection circuit (OTP) 12 detects that the temperature of a class-D audio amplifier in operation exceeds a preset value, for example 150° C., it triggers a signal Shutdown to disable the gate drivers 10. This shutdown mechanism, though being capable of protecting the class-D audio amplifier from being burn-out, causes instant current cut-off to the load 11 and thus pops which result in auditory discomfort to the user of the class-D audio amplifier.

To reduce pops, an additional filter is introduced into the class-D audio amplifier to filter out the pops. Even after the pops are eliminated, an abrupt termination of the music being played still poses a nuisance to the listener.

SUMMARY OF THE INVENTION

An object of the present invention is to provide a thermal regulation apparatus for a class-D audio amplifier.

Another object of the present invention is to provide a thermal regulation method for a class-D audio amplifier.

A further object of the present invention is to provide a class-D audio amplifier with thermal regulation.

According to the present invention, a thermal regulation apparatus for a class-D audio amplifier uses a thermal sensor to assert an over-temperature signal to signal an automatic gain controller to decrease the gain of the class-D audio amplifier if the temperature of the class-D audio amplifier in operation is detected to be higher than a temperature threshold.

Preferably, the thermal regulation apparatus uses a timer to assert a second over-temperature signal to further decrease the gain if the first over-temperature signal is detected to last for a time period longer than a time threshold.

Preferably, the thermal regulation apparatus uses a second thermal sensor to assert a second over-temperature signal to further decrease the gain if the temperature is detected to be higher than a second temperature threshold.

According to the present invention, a thermal regulation method for a class-D audio amplifier monitors the temperature of the class-D audio amplifier in operation and asserts an over-temperature signal to decrease the gain of the class-D audio amplifier if the temperature is detected to be higher than a temperature threshold.

Preferably, the thermal regulation method asserts a second over-temperature signal to further decrease the gain if the first over-temperature signal is detected to last for a time period longer than a time threshold.

Preferably, the thermal regulation apparatus asserts a second over-temperature signal to further decrease the gain if the temperature is detected to be higher than a second temperature threshold.

According to the present invention, a class-D audio amplifier includes a pre-amplifier with a gain to amplify an input signal, a pulse width modulator to provide a PWM signal which a current source 20 is connected to a PNP transistor 24 for the PNP transistor 24 to establish a temperature-dependent current $I_E$, resistors Rhys and Rs are serially connected between the emitter and base of the PNP transistor 24, and a current source 26 is connected to the base of the PNP transistor 24 for bias, so that $I_{PTAT,p}=I_E+V_{EB}/(Rs+Rhys)$, where the term $V_{EB}/(Rs+Rhys)$ is the current flowing through the resistors Rhys and Rs. When the temperature of the PNP transistor 24 increases, the emitter current $I_E$ increases accordingly, and the voltage $V_{EB}$ decreases. If the voltage $V_{EB}$ falls below a voltage threshold such that the output of the NOT gate 22 turns to high, the over-temperature signal TS is triggered and the transistor 28 shunt to the resistor Rhys is turned on. The conductive transistor 28 not only bypasses the resistor Rhys to provide hysteresis consequently, but also lowers the series resistance between the emitter and base of the PNP transistor 24. As a result, the emitter current $I_E$ is forced to decrease, thereby preventing the PNP transistor 24 from being burned out by an otherwise excessively large current.

Figure 4:
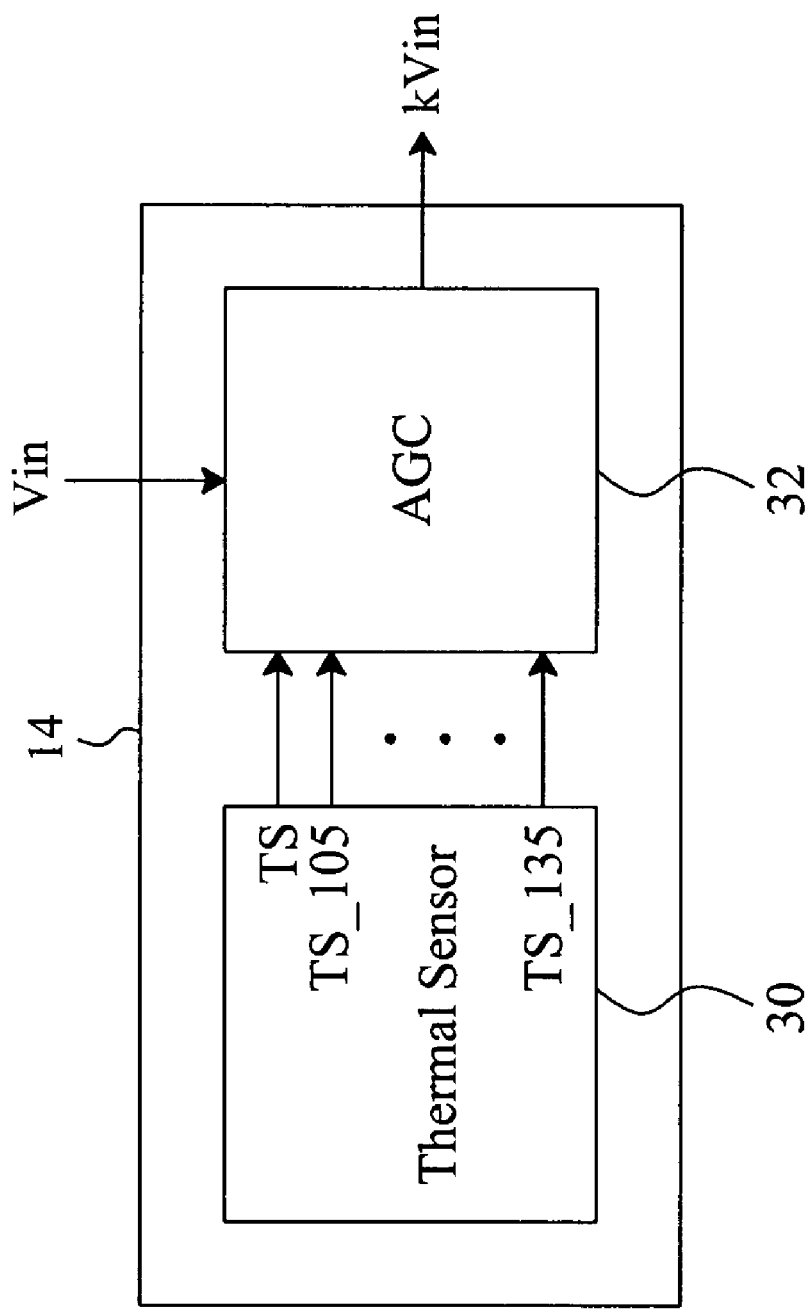
FIG. 4 is a circuit diagram of a multi-step thermal regulation apparatus according to the present invention.

Alternatively, it may use multiple thermal sensors 15 to assert multiple over-temperature signals TS to realize multi-step gain control. By furnishing the resistor Rs with different resistances and setting the resistance of the resistor Rhys within its hysteresis range, the thermal sensor 15 shown in FIG. 3 will generate various over-temperature signals TS when the temperature reaches different thresholds, thus enabling multiple gain adjustments. As shown in FIG. 4, when the temperature of the class-D audio amplifier reaches different temperature thresholds, the thermal sensor 30 will trigger over-temperature signals TS, TS_105, . . . , TS_135, respectively, causing an automatic gain controller 32 to step down the gain k of the class-D audio amplifier gradually.

Figure 5:
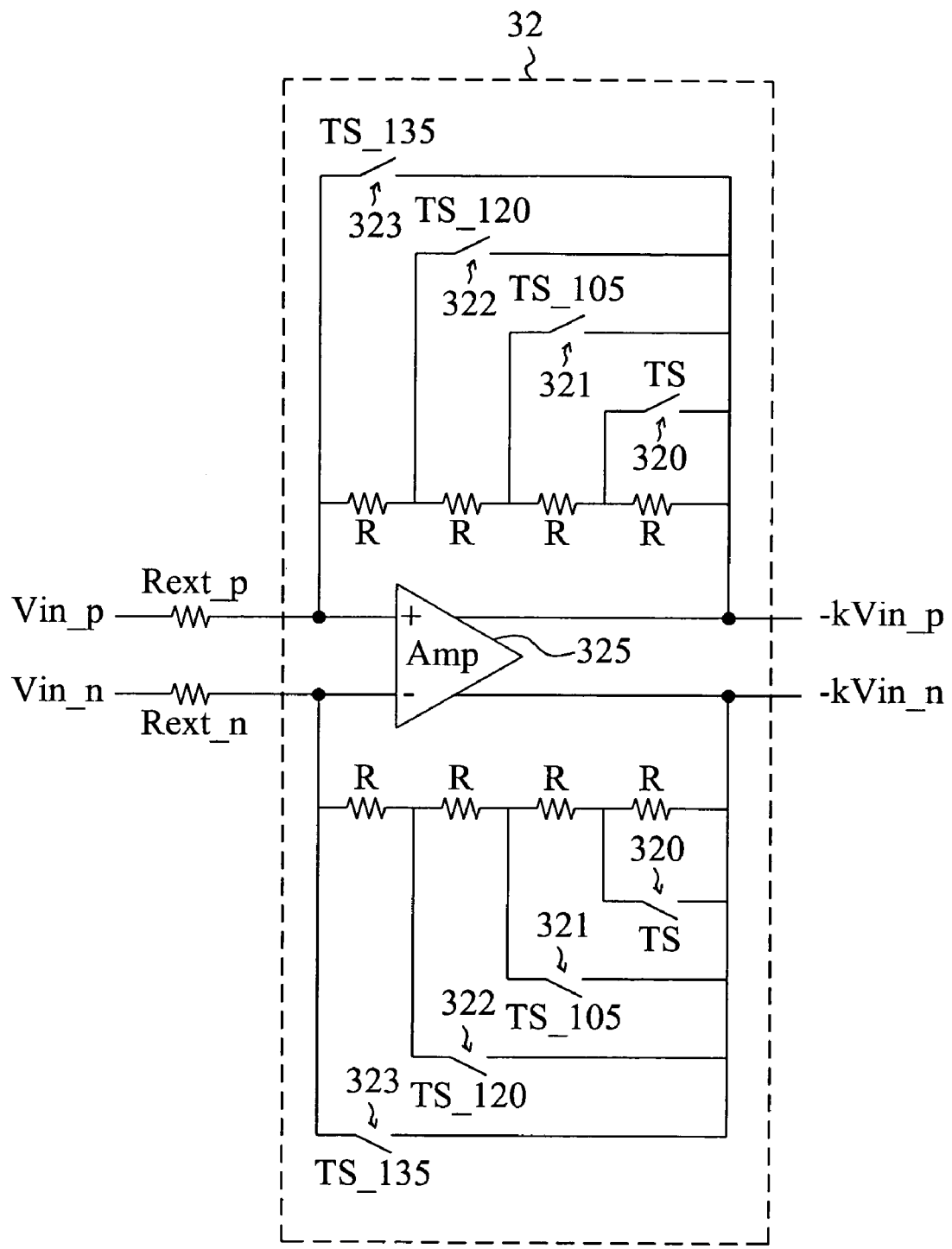
FIG. 5 is a circuit diagram of an automatic gain controller in an embodiment of the present invention.

An embodiment for the automatic gain controller 32 is shown in FIG. 5, in which resistors Rext_p and Rext_n are connected respectively to the positive and negative inputs of an inverting amplifier 325. For the sake of simplicity, the following description refers only to the positive signal Vin_p of the differential input. Four resistors R are connected in series between the positive input and a positive output of the inverting amplifier 325, and switches 320, 321, 322, 323 are shunt to the four resistors R, respectively. When the temperature of the class-D audio amplifier is within a normal range, all the switches 320~323 are open circuit. When the temperature reaches 100° C., the thermal sensor 30 asserts the over-temperature signal TS to close the switch 320 and thereby decrease the gain k of the automatic gain controller 32. When the temperature exceeds 105° C., the thermal sensor 30 further asserts the over-temperature signal TS_105 to close the switch 321 to further decrease the gain k of the automatic gain controller 32. When the temperature exceeds 120° C., the thermal sensor 30 further asserts the over-temperature signal TS_120 to close the switch 322 to further decrease the gain k of the automatic gain controller 32. When the temperature exceeds 135° C., the thermal sensor 30 further asserts the over-temperature signal TS_135 to close the switch 323 to further decrease the gain k of the automatic gain controller 32. By this way, a multi-step gain control is achieved. In one embodiment, the gain k is stepped down by −0.5 dB in each step.

Figure 6:
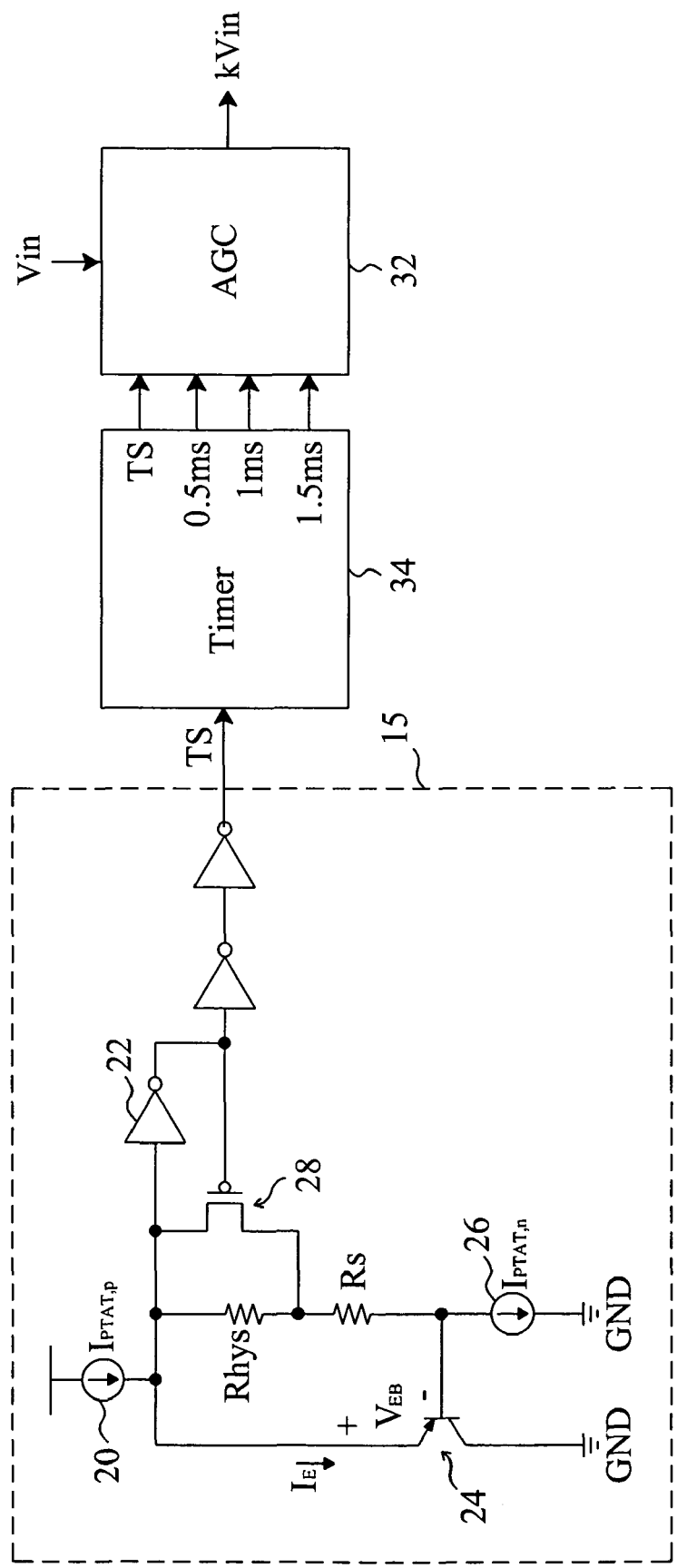
FIG. 6 is a circuit diagram of a thermal regulation apparatus in another embodiment of the present invention.

FIG. 6 is a circuit diagram of another embodiment for the thermal regulation apparatus 14 shown in FIG. 2, in which a timer 34 is provided between the thermal sensor 15 and the automatic gain controller 32. When the temperature of the class-D audio amplifier reaches 100° C., the thermal sensor 15 asserts an over-temperature signal TS to decrease the gain k, and then the timer 34 counts while the over-temperature signal TS lasts. When the counted time reaches 0.5 ms, a second over-temperature signal is asserted; when 1 ms is reached, a third over-temperature signal is asserted; and when 1.5 ms is reached, a fourth over-temperature signal is asserted. Thus, the automatic gain controller 32 decreases the gain k step by step. When the temperature falls below 100° C., the over-temperature signal TS terminates, thereby resetting the timer 34. As a result, all the over-temperature signals are OFF, and the class-D audio amplifier resumes operation at the original gain.

Figure 7:
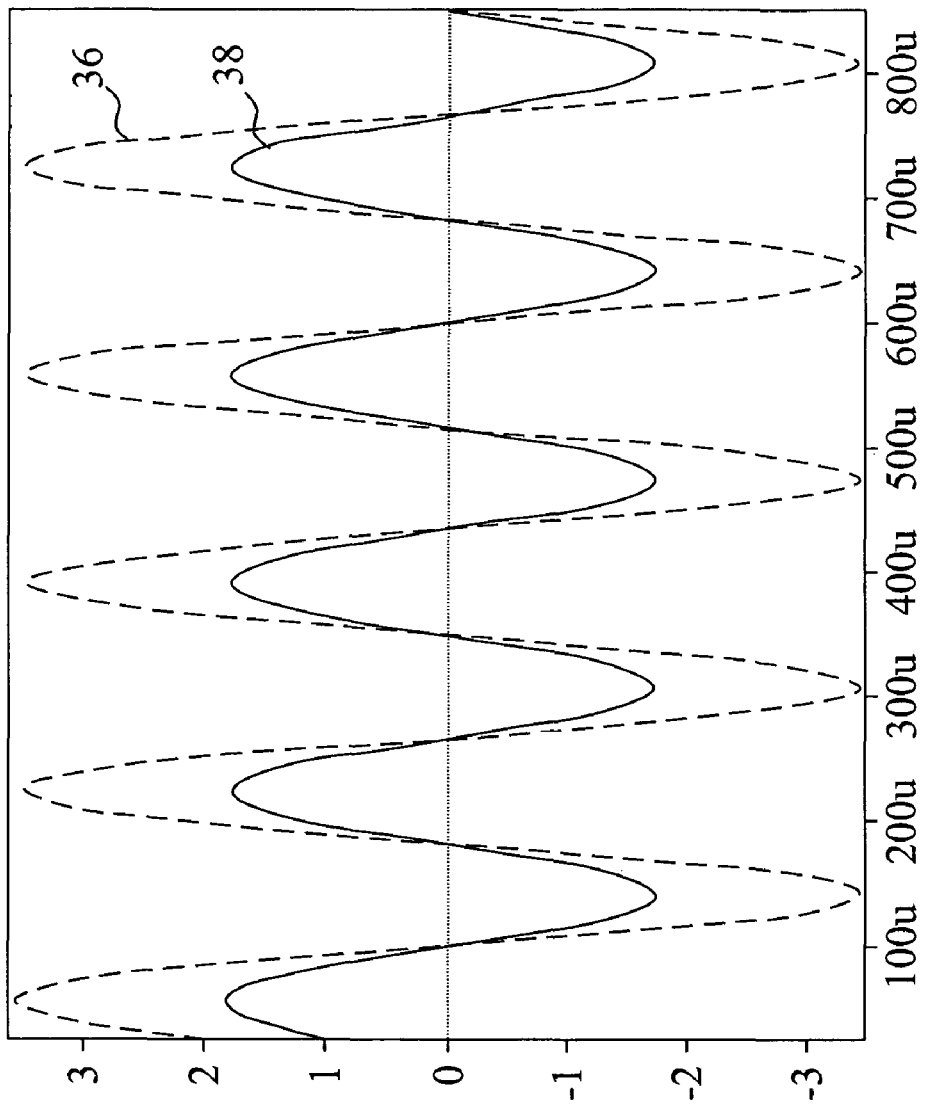
FIG. 7 is a diagram of a simulated output signal of a class-D audio amplifier with thermal regulation according to the present invention.

FIG. 7 is a diagram of a simulated output signal of a class-D audio amplifier using the thermal regulation apparatus 14, in which waveform 36 represents the output of the class-D audio amplifier operating at 25° C., and waveform 38 represents the output of the class-D audio amplifier at 125° C. As shown in FIG. 7, when the temperature reaches 125° C., the output waveform 38 of the class-D audio amplifier is smaller than the output waveform 36 of the class-D audio amplifier at 25° C., while the class-D audio amplifier is nevertheless working.

Figure 8:
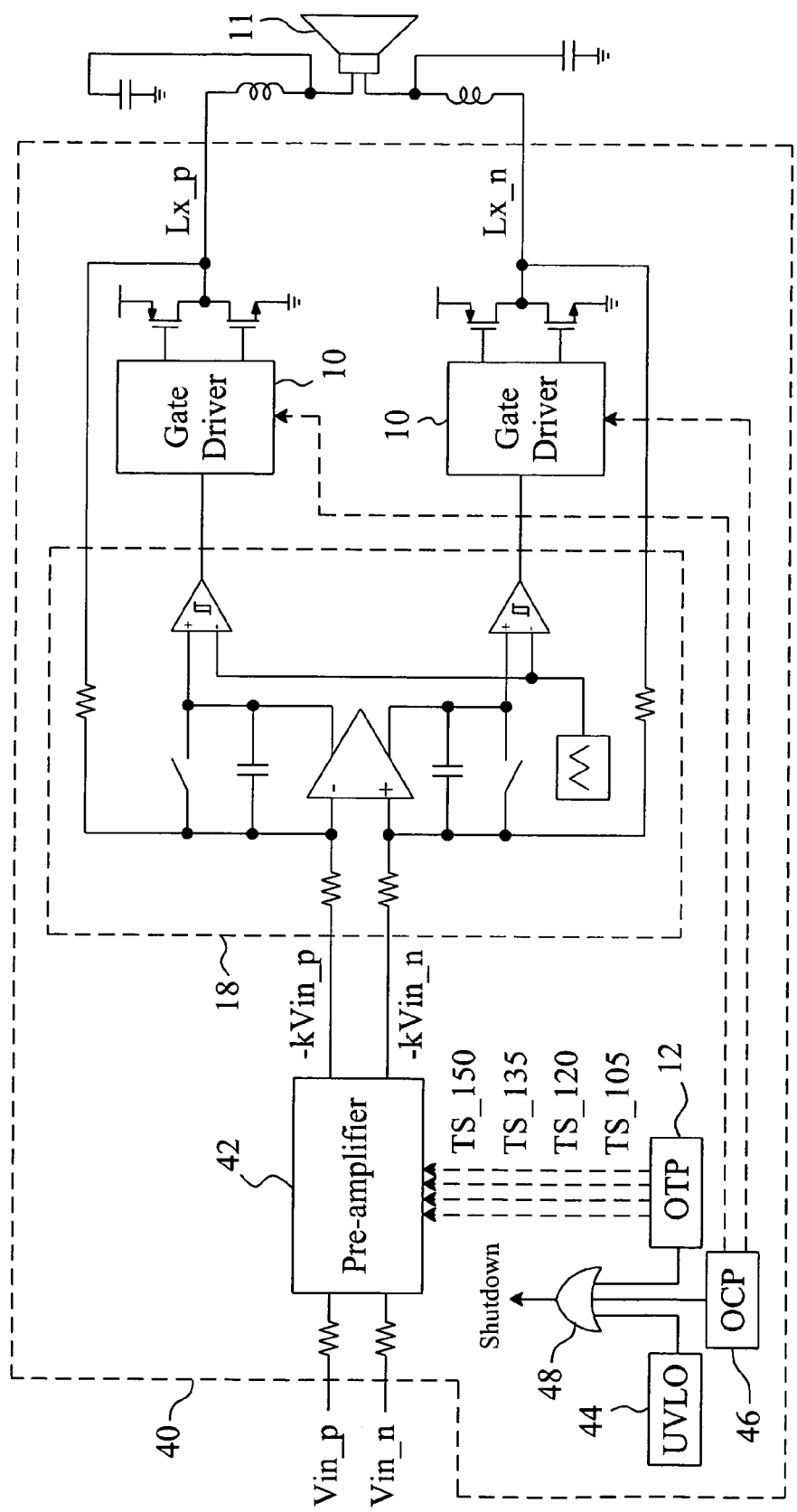
FIG. 8 is a circuit diagram of a class-D audio amplifier with thermal regulation according to the present invention.

In a class-D audio amplifier 40 as shown in FIG. 8, a pulse width modulator 18 and a pre-amplifier 42 both are prior arts, and an undervoltage lockout circuit (UVLO) 44, an over-current protection circuit (OCP) 46, an over-temperature protection circuit (OTP) 12, and an OR gate 48, which constitute the major part of a protection system typically found in like devices, are configured to monitor the operating status of the class-D audio amplifier 40, so as to assert a shutdown signal to turn off the class-D audio amplifier 40 upon occurrence of an excessively low voltage, an excessively large current, or an unduly high temperature. In this embodiment, the automatic gain controller 16 according to the present invention is integrated with the pre-amplifier 42 and the thermal sensor 15 according to the present invention is integrated with the over-temperature protection circuit 12. Further, the temperature thresholds for activating thermal regulation are set at 105° C., 120° C., 135° C., and 150° C. When the temperature of the class-D audio amplifier 40 rises to 105° C., the over-temperature protection circuit 12 asserts an over-temperature signal TS_105 to signal the pre-amplifier 42 to decrease the gain k. When the temperatures further goes up to 120° C., the over-temperature protection circuit 12 asserts an over-temperature signal TS_120 to signal the pre-amplifier 42 to further decrease the gain k. The process continues analogously. The decrease of the gain k leads to the reduction of input into the pulse width modulator 18, and in consequence the differential output (Lx_p–Lx_n) of the amplifier 40 attenuates. By means of this mechanism, the output of the class-D audio amplifier 40 will attenuate each time the temperature exceeds a specific temperature threshold for activating thermal regulation, thereby lowering the temperature of the class-D audio amplifier 40. The thermal regulation apparatus according to the present invention may work in conjunction with the conventional over-temperature protection circuit 12 shown in FIG. 1 in such a way that, when the temperature of the class-D audio amplifier 40 rises to a certain threshold, the shutdown signal Shutdown is triggered to turn off the class-D audio amplifier 40. However, after the aforesaid gain reduction control process, the chance for the class-D audio amplifier 40 to stop working due to overheating is greatly reduced, thus minimizing the auditory discomfort caused to the listener.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A thermal regulation apparatus for a class-D audio amplifier, comprising:
a thermal sensor for monitoring a temperature of the class-D audio amplifier in operation to assert a first over-temperature signal if the thermal sensor detects the temperature being higher than a temperature threshold;
an automatic gain controller coupled to the thermal sensor for decreasing a gain of the class-D audio amplifier in response to the first over-temperature signal; and
a timer coupled to the thermal sensor and automatic gain controller for monitoring the first over-temperature signal to assert a second over-temperature signal to signal the automatic gain controller to further decrease the gain if the timer detects the first over-temperature signal lasting for a time duration longer than a time threshold.

2. A thermal regulation apparatus for a class-D audio amplifier, comprising:
a thermal sensor for monitoring a temperature of the class-D audio amplifier in operation to assert a first over-temperature signal if the thermal sensor detects the temperature being higher than a first temperature threshold;
an automatic gain controller coupled to the thermal sensor for decreasing a gain of the class-D audio amplifier in response to the first over-temperature signal; and
a second thermal sensor coupled to the automatic gain controller for monitoring the temperature of the class-D audio amplifier in operation to assert a second over-temperature signal to signal the automatic gain controller to further decrease the gain if the second thermal sensor detects the temperature being higher than a second temperature threshold.

3. The thermal regulation apparatus of claim 1, wherein the thermal sensor comprises:
a bipolar junction transistor;
a current source coupled to the bipolar junction transistor for the bipolar junction transistor to establish a temperature-dependent current; and
a voltage detector coupled to the bipolar junction transistor and current source for monitoring a base-emitter voltage of the bipolar junction transistor to trigger the first over-temperature signal if the voltage detector detects the base-emitter voltage being lower than a voltage threshold.

4. The thermal regulation apparatus of claim 3, wherein the bipolar junction transistor is a PNP transistor.

5. A thermal regulation method for a class-D audio amplifier, comprising the steps of:
monitoring a temperature of the class-D audio amplifier in operation, the step of monitoring including:
a. establishing a temperature-dependent current by a bipolar junction transistor; and
b. monitoring a base-emitter voltage of the bipolar junction transistor;
asserting an over-temperature signal if the temperature is higher than a temperature threshold; and
decreasing a gain of the class-D in response to the over-temperature signal.

6. A thermal regulation method for a class-D audio amplifier, comprising the steps of:
monitoring a temperature of the class-D audio amplifier in operation;
asserting a first over-temperature signal if the temperature is higher than a temperature threshold;
decreasing a gain of the class-D in response to the first over-temperature signal;
monitoring the first over-temperature signal;
asserting a second over-temperature signal if the first over-temperature signal lasts for a time duration longer than a time threshold; and
further decreasing the gain in response to the second over-temperature signal.

7. A thermal regulation method for a class-D audio amplifier, comprising the steps of:
monitoring a temperature of the class-D audio amplifier in operation;
asserting a first over-temperature signal if the temperature is higher than a first temperature threshold;
decreasing a gain of the class-D in response to the first over-temperature signal;
asserting a second over-temperature signal if the temperature is higher than a second temperature threshold; and
further decreasing the gain in response to the second over-temperature signal.

8. A class-D audio amplifier with thermal regulation, comprising:
a pre-amplifier with a gain for amplifying an input signal of the class-D audio amplifier;
a pulse width modulator coupled to the pre-amplifier for providing a PWM signal according to the amplified input signal; and
an over-temperature protection circuit coupled to the pre-amplifier for monitoring a temperature of the class-D audio amplifier in operation to assert a first over-temperature signal to decrease the gain if the temperature is higher than a temperature threshold, the over-temperature protection circuit including:
a. a thermal sensor for monitoring the temperature to assert the first over-temperature signal if the thermal sensor detects the temperature being higher than the temperature threshold; and
b. a timer coupled to the thermal sensor and pre-amplifier for monitoring the first over-temperature signal to assert a second over-temperature signal to further decrease the gain if the timer detects the first over-temperature signal lasting for a time duration longer than a time threshold.

9. The class-D audio amplifier of claim 8, wherein the thermal sensor comprises:
a bipolar junction transistor;
a current source coupled to the bipolar junction transistor for the bipolar junction transistor to establish a temperature-dependent current; and
a voltage detector coupled to the bipolar junction transistor and current source for monitoring a base-emitter voltage of the bipolar junction transistor to trigger the first over-temperature signal if the voltage detector detects the base-emitter voltage being lower than a voltage threshold.

10. The class-D audio amplifier of claim 9, wherein the bipolar junction transistor is a PNP transistor.

11. A class-D audio amplifier with thermal regulation, comprising:
a pre-amplifier with a gain for amplifying an input signal of the class-D audio amplifier;
a pulse width modulator coupled to the pre-amplifier for providing a PWM signal according to the amplified input signal; and an over-temperature protection circuit coupled to the pre-amplifier for monitoring a temperature of the class-D audio amplifier in operation to assert a first over-temperature signal to decrease the gain if the temperature is higher than a first temperature threshold, the over-temperature protection circuit including:
- a. a first thermal sensor for monitoring the temperature to assert the first over-temperature signal if the first thermal sensor detects the temperature being higher than the first temperature threshold; and
- b. a second thermal sensor for monitoring the temperature to assert a second over-temperature signal to further decrease the gain if the second thermal sensor detects the temperature being higher than a second temperature threshold.

12. The class-D audio amplifier of claim 11, wherein the first thermal sensor comprises:
   a bipolar junction transistor;
   a current source coupled to the bipolar junction transistor for the bipolar junction transistor to establish a temperature-dependent current; and
   a voltage detector coupled to the bipolar junction transistor and current source for monitoring a base-emitter voltage of the bipolar junction transistor to trigger the first over-temperature signal if the voltage detector detects the base-emitter voltage being lower than a voltage threshold.

13. The class-D audio amplifier of claim 12, wherein the bipolar junction transistor is a PNP transistor.

14. The class-D audio amplifier of claim 11, wherein the second thermal sensor comprises:
   a bipolar junction transistor;
   a current source coupled to the bipolar junction transistor for the bipolar junction transistor to establish a temperature-dependent current; and
   a voltage detector coupled to the bipolar junction transistor and current source for monitoring a base-emitter voltage of the bipolar junction transistor to trigger the second over-temperature signal if the voltage detector detects the base-emitter voltage being lower than a voltage threshold.

15. The class-D audio amplifier of claim 14, wherein the bipolar junction transistor is a PNP transistor.

16. The thermal regulation apparatus of claim 2, wherein the thermal sensor comprises:
   a bipolar junction transistor;
   a current source coupled to the bipolar junction transistor for the bipolar junction transistor to establish a temperature-dependent current; and
   a voltage detector coupled to the bipolar junction transistor and current source for monitoring a base-emitter voltage of the bipolar junction transistor to trigger the first over-temperature signal if the voltage detector detects the base-emitter voltage being lower than a voltage threshold.

17. The class-D audio amplifier of claim 16, wherein the bipolar junction transistor is a PNP transistor.

* * * * *